(12) United States Patent  (10) Patent No.: US 7,193,845 B2
Titus  (45) Date of Patent: Mar. 20, 2007

(54) REMOVABLE CAGE FOR A COMPUTER CHASSIS

(75) Inventor: Calvin Gregory Titus, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 11 days.

(21) Appl. No.: 11/041,679

(22) Filed: Jan. 24, 2005

(65) Prior Publication Data

US 2006/0164814 A1   Jul. 27, 2006

(51) Int. Cl.
*G06F 1/16* (2006.01)
*H05K 7/00* (2006.01)

(52) U.S. Cl. .................. 361/685; 439/488; 710/1; 455/550.1

(58) Field of Classification Search ........... 361/731, 361/679–687, 724–727; 455/550.1; 439/488; 710/1, 100; 312/221.1, 221.2
See application file for complete search history.

(56) References Cited

U.S. PATENT DOCUMENTS

| 6,311,071 | B1 * | 10/2001 | Voroba et al. | 455/550.1 |
| 6,906,914 | B2 * | 6/2005 | Stamos et al. | 361/683 |
| 6,947,287 | B1 * | 9/2005 | Zansky et al. | 361/731 |
| 6,987,667 | B1 * | 1/2006 | Mease et al. | 361/687 |

* cited by examiner

*Primary Examiner*—Hung Van Duong

(57) ABSTRACT

The present invention is directed to a removable cage for a computer chassis assembly. Such cage is comprised of a frame. The frame includes a top, a bottom and two sides. In an exemplary embodiment, a midplane is coupled to the frame for providing a place to mount at least one disk drive. The midplane may include a midplane cover plate. Such plate provides protection to the midplane upon removal and insertion of the midplane. In an exemplary embodiment, the midplane cover plate is operationally coupled to the midplane which is in turn coupled to the frame via tooling pins. Finally, a plurality of fasteners are coupled to the frame for attaching the frame to the midplane and computer chassis assembly. The fasteners align and mount the frame including the midplane to the computer chassis assembly allowing for removal of the midplane without affecting the computer chassis configuration.

20 Claims, 4 Drawing Sheets

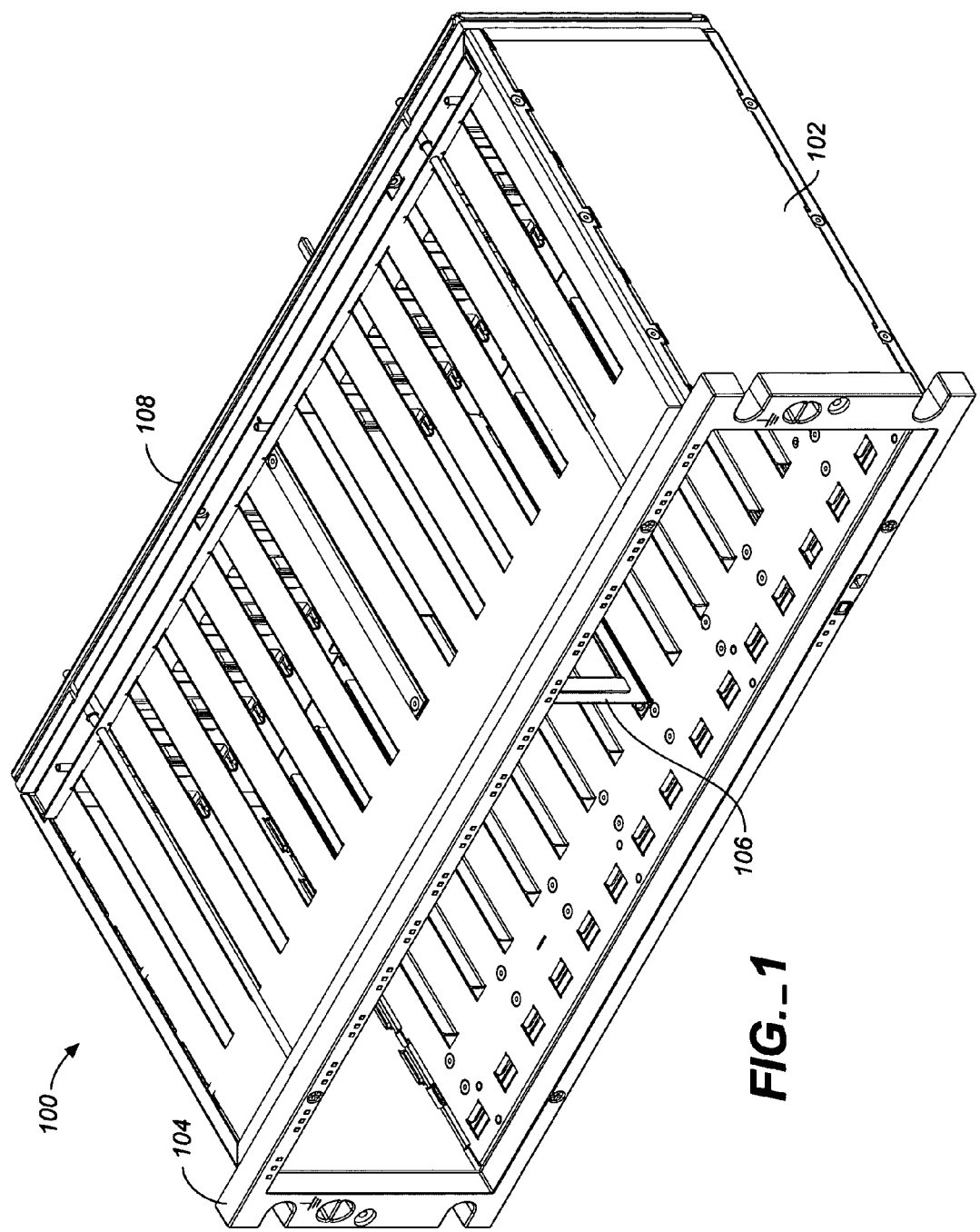
FIG._1

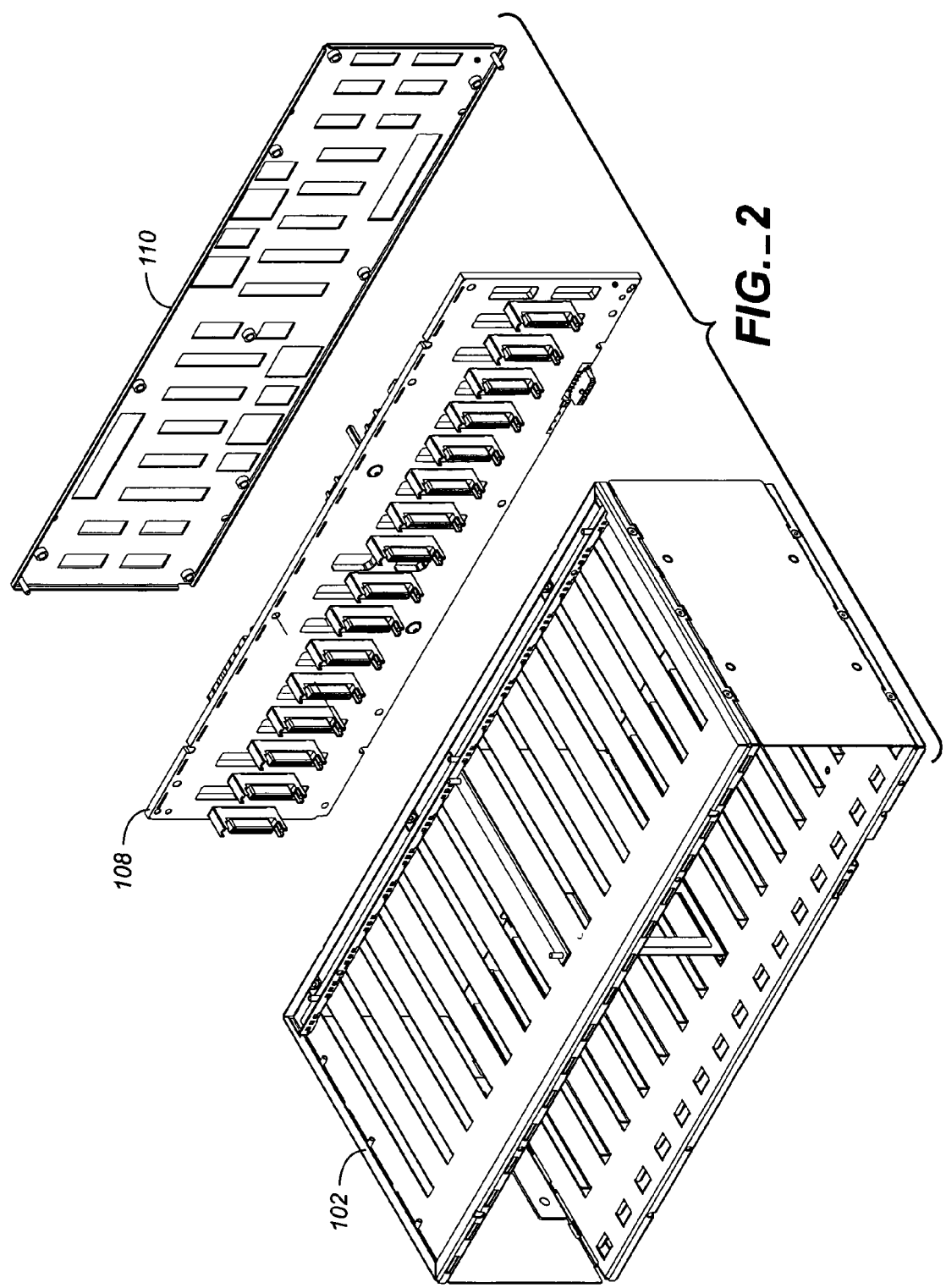
FIG._2

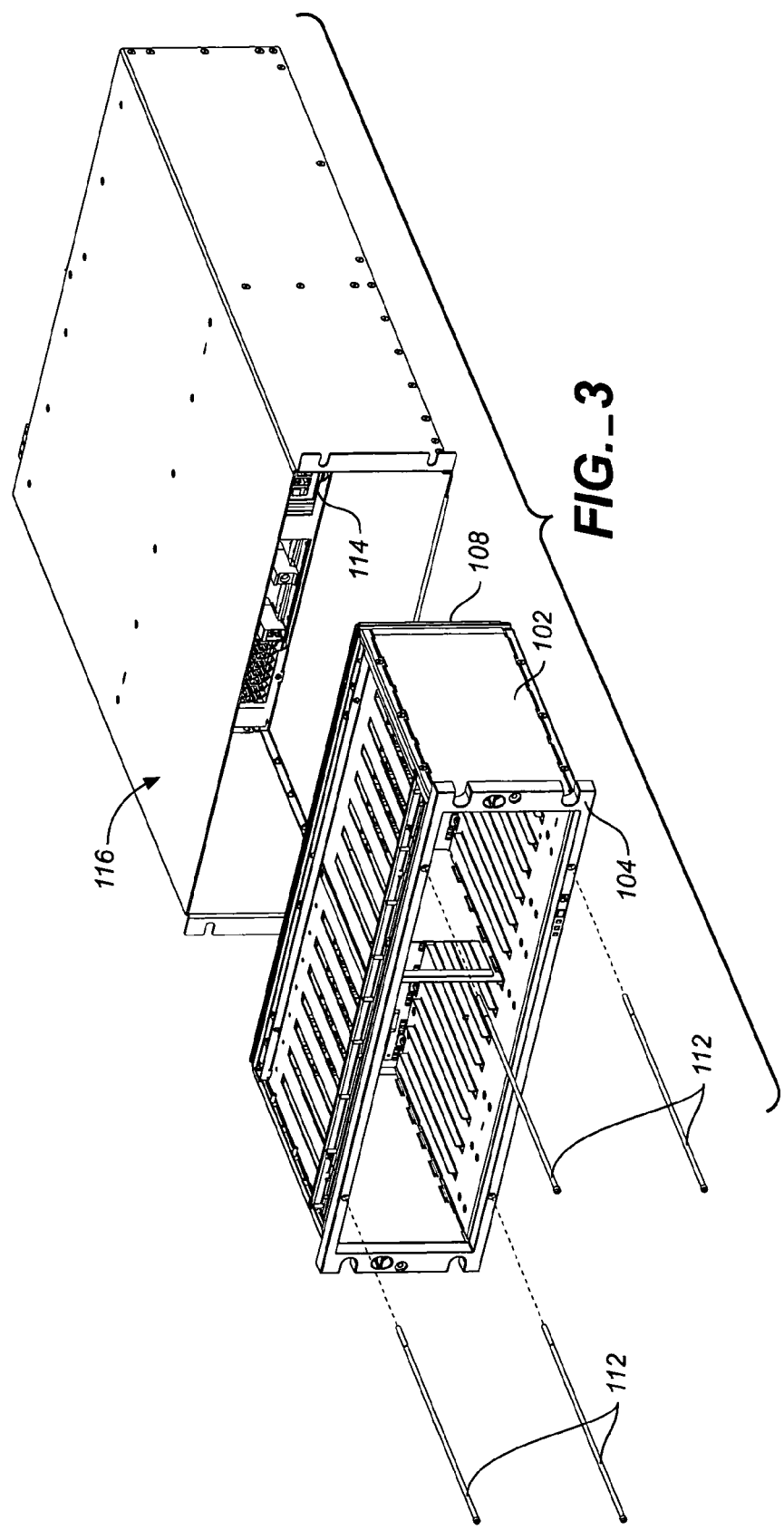
FIG._3

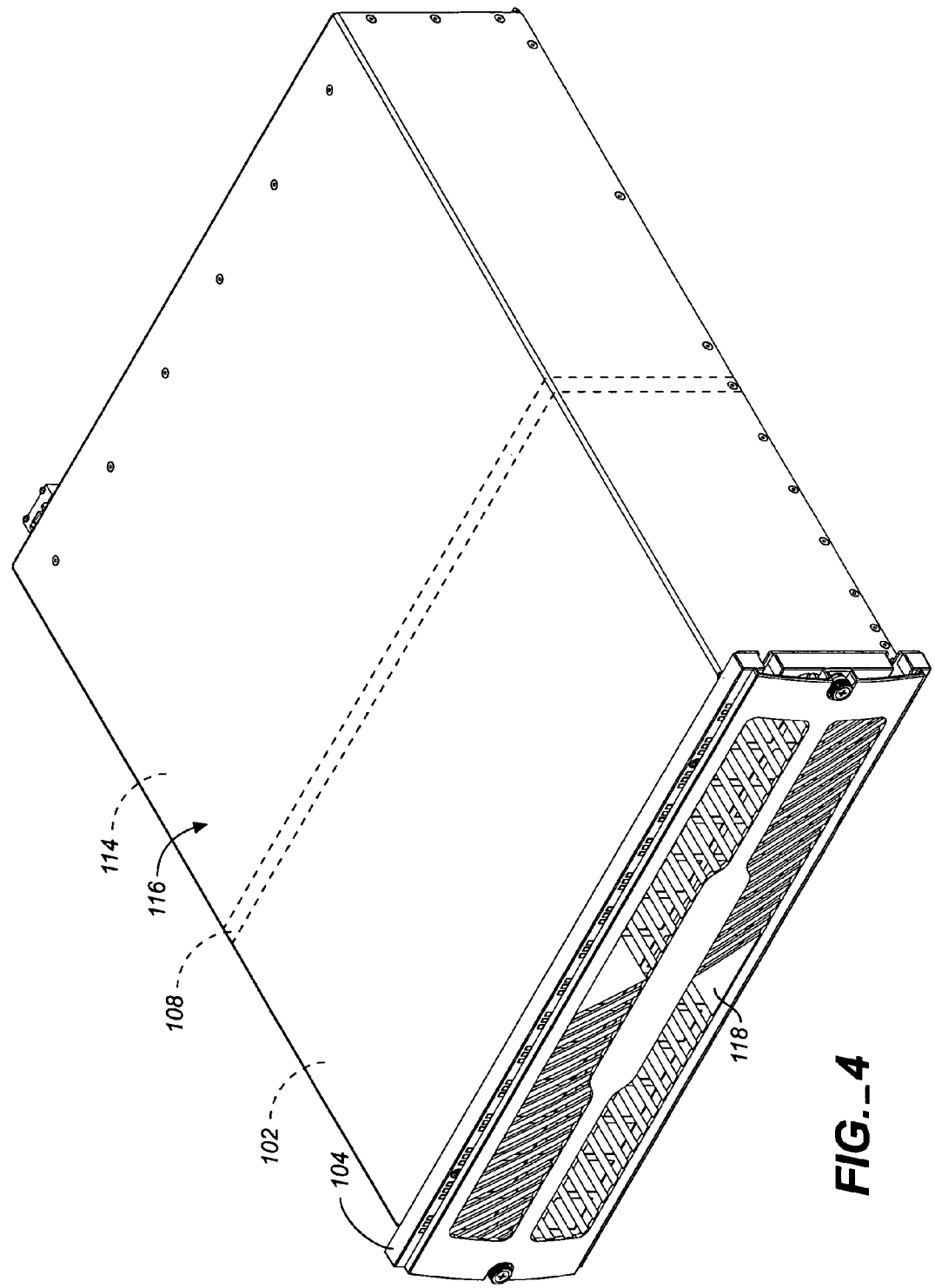
FIG._4

REMOVABLE CAGE FOR A COMPUTER CHASSIS

FIELD OF THE INVENTION

The present invention relates to the field of computer system configurations and housings and more particularly to a removable front cage for a chassis.

BACKGROUND OF THE INVENTION

The ever increasing complexity of modem computer systems and information networks has caused user requirements for external data storage to increase enormously. To accommodate a user's desire to store large amounts of data, a number of different mechanisms have been developed to allow multiple hard disk drives to be stored within a single housing unit or enclosure. For example, a rack-mountable enclosure known in the art as a chassis or a "cage" is capable of holding multiple disk drives at a given time. Drives installed within the chassis communicate with each other via a chassis midplane.

Although the use of computer chassis systems has significantly increased the ability of a user to store large quantities of data within a given system, such systems are disadvantageous in many respects. First, the controller, power supply and associated cables for a given system are often located in the rear of the chassis. Conventional chassis systems require total disassembly prior to insertion or removal of a desired component (e.g. hard drive or midplane). For example, midplanes are generally characterized as field replaceable units (FRU), indicating that such units are to be serviced and/or removed by trained personnel. Although servicing personnel are trained to perform the aforementioned task, a typical time period for installation of a midplane in a currently available computer chassis is approximately two hours. As a result, the task of servicing and/or removing a midplane is very cumbersome and cost-inefficient.

Therefore, it would be desirable to a provide a chassis system which allowed installation to be fast, easy and dependable.

SUMMARY OF THE INVENTION

Accordingly, the present invention is directed to a removable cage for a computer chassis. In an exemplary embodiment, the cage is comprised of a frame. The frame includes a top, a bottom and two sides. In an additional embodiment, a cast metal face plate is coupled to the frame for front features and rigidity. Further, a divider may be coupled to the frame for dividing the frame. Such divider includes a handle for insertion and removal of the frame into the computer chassis. In further embodiments, a midplane is coupled to the frame for providing a place to mount at least one disk drive. The midplane may also include a midplane cover plate. In an exemplary embodiment, the midplane cover plate is operationally coupled to the midplane which is in turn coupled to the frame via tooling pins. Finally, a plurality of fasteners are coupled to the frame for attaching the frame to the midplane and the computer chassis. In an exemplary embodiment, the plurality of fasteners includes four (4) screws. The fasteners align and mount the frame coupled to the midplane to the computer chassis allowing for removal of the midplane without affecting the computer chassis configuration.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is an isometric view of a cage assembly in accordance with an aspect of the present invention;

FIG. 2 is an isometric view of the cage assembly of FIG. 1, wherein a midplane and midplane cover plate are illustrated;

FIG. 3 is an isometric view of the cage assembly of FIG. 1, illustrating the use of four screws to couple a face plate with the cage assembly and ultimately to a rear sub-chassis assembly; and FIG. 4 is an isometric view of a computer chassis assembled including the cage assembly and the rear sub-chassis assembly.

DETAILED DESCRIPTION OF THE INVENTION

Reference will now be made in detail to the presently preferred embodiments of the invention, examples of which are illustrated in the accompanying drawings. It is to be appreciated that corresponding reference numbers refer to generally corresponding structures.

Referring in general to FIGS. 1–4, a removable cage for a computer chassis is provided in accordance with the present invention. The instant cage is designed so that a midplane may be mounted or receive service without requiring the computer chassis, customer replaceable units (CRU) and rear cables to be removed. One of the advantageous embodiments of the present invention employs the use of only four (4) screws to secure the front cage to the computer chassis. Thus, the instant invention allows the installation and servicing of the midplane to be fast, easy and dependable whereby it allows such actions to be taken without affecting the computer chassis configuration.

Referring now specifically to FIG. 1, a removable front cage 100 for a computer chassis in accordance with an exemplary embodiment of the instant invention is provided. Such cage 100 is comprised of a frame 102. The frame includes a top, a bottom and two sides. In an embodiment, the frame 102 is formed of sheet metal (e.g. 0.036 inch sheet metal) and configured such that there is a lead in and slip fit toleranced fit when engaged with a computer chassis. It is contemplated that standard electromagnetic interference (EMI) shielding and gasketing may be used throughout the removable front cage 100 to prevent such interference within the system. Further, it is contemplated that additional materials such as cast aluminum alloy, cast alloy metal, and the like which may provide thermal management and possibly reduce operating temperatures may also be employed to form the frame 102.

In an embodiment, a face plate 104 is coupled to the frame. The cast metal face plate 104 provides a place for the display of front features as well as increases the rigidity of the front cage 100. In an exemplary embodiment, the face plate 104 is formed of cast metal however it is contemplated that additional materials including aluminum alloy, and the like may be used. Moreover, the face plate 104 is secured to the frame 102 via fasteners. For example, the face plate 104 includes apertures in which fasteners including screws are placed in order to secure the face plate 104 to the frame 102. Additionally, a divider 106 is coupled to the frame 102 thereby dividing the frame 102. In an exemplary embodiment, such divider 106 includes a handle. The presence of the handle allows for easy insertion and removal of the frame 102 into a computer chassis 114. In additional embodiments, a bezel 118 (as shown in FIG. 4) is integrated into the removable front cage 100. For example, such bezel 118 is formed to snap-on to front cage 100 allowing a custom look. Moreover, use of a bezel may assist in air filtering, EMI shielding, and obtaining Network Equipment Building System (NEBS) approval.

As illustrated in FIG. 2, a midplane 108 is coupled to the frame 102 for providing a place to mount multiple disk drives and allow for communications between each of the drives and a computer chassis 114 (as shown in FIG. 4). In an exemplary embodiment, the midplane 108 includes a midplane cover plate 110. The midplane cover plate 110 is operationally coupled to the midplane 108 via fasteners. In an exemplary embodiment, the midplane cover plate 110 is operationally coupled to the midplane 108 which is in turn coupled to the frame 102 via tooling pins. The midplane cover plate 110 provides protection to the midplane 108 upon insertion and pullout of the midplane 108.

As illustrated in FIG. 3, a plurality of fasteners 112 are coupled to the frame 102 for attaching the frame 102 to the midplane 108 and a rear computer chassis 114. The fasteners 112 align and mount the frame 102 coupled to the midplane 108 to the rear computer chassis 114 forming a stable chassis assembly. In an exemplary embodiment, the plurality of fasteners 112 includes four (4) screws. For example, four long #6 jackscrews are captured through the face plate 104, run along through the frame 102 into the midplane 108. Once aligned with a rear computer chassis 114 which is mounted within a housing 116, the jackscrews allow the frame 102 to be mounted to such chassis. The entire configuration assembled is illustrated in FIG. 4.

In use, the instant invention may be mounted within a 3U rack mount chassis assembly. In such assembly, a rear frame is included within the chassis assembly to stabilize the overall chassis assembly. In an exemplary embodiment, stabilization is accomplished via placement of a 0.060 inch sheet metal "wrapper" around the rear frame. The removable front cage 100 is then aligned and mounted to the rear frame via only four front mounted easily accessable screws (e.g. jackscrews). Such configuration forms a solid, stable chassis assembly capable of housing multiple drives (e.g. sixteen 3.5 inch drives). As stated previously, one of the advantageous features of the present invention is that the rear frame (or chassis), rear customer replaceable units, and rear cable removal are not required for midplane replacement. Additionally, it is contemplated that the removable cage may be coupled to additional types of computer chassis assemblies without departing from the scope and spirit of the present invention.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A removable cage for a computer chassis assembly, comprising:
   a frame, the frame including a top, a bottom, and two sides;
   a midplane coupled to the frame for providing a place to mount at least one disk drive, and
   a plurality of fasteners coupled to the frame for attaching the removable cage to the computer chassis assembly, wherein the fasteners align and mount the frame to the computer chassis assembly when the frame is inserted into the computer chassis assembly allowing for removal of the frame and the coupled midplane without affecting the computer chassis configuration.

2. The removable cage for a computer chassis assembly as claimed in claim 1, further comprising a divider including a handle coupled to the frame allowing for insertion and removal of the removable cage with the computer chassis.

3. The removable cage for a computer chassis assembly as claimed in claim 1, wherein the midplane is coupled to the frame via a multitude of connectors.

4. The removable cage for a computer chassis assembly as claimed in claim 1, wherein the frame is formed of 0.036 inch sheet metal.

5. The removable cage for a computer chassis assembly as claimed in claim 1, wherein the plurality of fasteners is four (4).

6. The removable cage for a computer chassis assembly as claimed in claim 3, wherein the multitude of connectors includes tooling pins.

7. The removable cage for a computer chassis assembly as claimed in claim 5, wherein the four (4) fasteners are screws.

8. A removable cage for a computer chassis, comprising:
   a frame, the frame including a, top, a bottom and two sides;
   a divider coupled to the frame for dividing the frame, the divider including a handle allowing for insertion and removal of the frame into the computer chassis;
   a midplane coupled to the frame for providing a place to mount at least one disk drive, the midplane including a midplane cover plate for protecting the midplane from damage upon removal and insertion of such midplane, the midplane cover plate being operationally coupled to the midplane; and
   a plurality of fasteners coupled to the frame for attaching the frame to the midplane and the computer chassis, wherein the fasteners align and mount the frame that is coupled to the midplane to the computer chassis allowing for removal of the frame and the coupled midplane without affecting the computer chassis configuration.

9. The removable cage for a computer chassis as claimed in claim 8, wherein the frame is formed of 0.036 sheet metal.

10. The removable cage for a computer chassis as claimed in claim 8, wherein the plurality of fasteners is four (4).

11. The removable cage for a computer chassis as claimed in claim 8, wherein the midplane cover plate is operationally coupled to the midplane via tooling pins.

12. The removable cage for a computer chassis as claimed in claim 8, further comprising a cast metal face plate coupled to the frame for front features and rigidity.

13. The removable cage for a computer chassis as claimed in claim 10, wherein the four (4) fasteners are screws.

14. A computer chassis assembly, comprising:
- a front cage, the cage including a frame, the frame including a divider with a handle allowing for insertion and removal of the frame into and out of the computer chassis assembly;
- a rear sub-chassis assembly coupled to the front cage for stabilizing the chassis assembly;
- a midplane operationally coupled to the frame for providing a place to mount a disk drive; and
- a plurality of fasteners coupled to the frame for attaching the frame to the rear sub-chassis assembly, wherein the fasteners align and mount the frame that is operationally coupled to the midplane to the rear sub-chassis assembly allowing for removal of the frame and the coupled midplane without affecting the rear sub-chassis configuration.

15. The computer chassis assembly as claimed in claim 14, further comprising a housing for enclosure of the computer chassis assembly.

16. The computer chassis assembly as claimed in claim 14, wherein the plurality of fasteners is four (4).

17. The computer chassis assembly as claimed in claim 14, wherein the midplane includes a cover plate.

18. The computer chassis assembly as claimed in claim 14, further comprising a cast metal face plate coupled to the frame far front features and rigidity.

19. The computer chassis assembly as claimed in claim 16, wherein the four (4) fasteners are screws.

20. The computer chassis assembly as claimed in claim 17, wherein the midplane is operationally coupled to the midplane and the frame via tooling pins.

* * * * *